United States Patent
Fukuzawa et al.

(10) Patent No.: US 6,515,047 B2
(45) Date of Patent: Feb. 4, 2003

(54) COMPOSITION OF EPOXY RESIN AND TRIAZINE-FORMALDEHYDE-PHENOL RESIN

(75) Inventors: Takao Fukuzawa, Yokkaichi (JP); Takayoshi Hirai, Yokkaichi (JP); Tetsuro Imura, Yokkaichi (JP); Yoshinobu Ohnuma, Yokkaichi (JP)

(73) Assignee: Resolution Performance Products, Houston, TX (US)

( * ) Notice: Subject to any disclaimer, the term of this patent is extended or adjusted under 35 U.S.C. 154(b) by 18 days.

(21) Appl. No.: 09/784,624

(22) Filed: Feb. 15, 2001

(65) Prior Publication Data
US 2001/0031851 A1 Oct. 18, 2001

(51) Int. Cl.[7] .................. C08G 12/32; C08G 12/40; C08K 03/22; C08L 63/02; C08L 63/04
(52) U.S. Cl. .................. 523/457; 525/481; 525/486; 525/490; 528/163
(58) Field of Search .................. 525/490, 481, 525/486; 523/457; 528/163

(56) References Cited

U.S. PATENT DOCUMENTS 5,952,447 A * 9/1999 Ikeda .................. 528/163
5,955,184 A * 9/1999 Honda et al. .................. 525/500

FOREIGN PATENT DOCUMENTS

| JP | 60-18531 A | * | 1/1985 |
| JP | 60-23467 A | * | 2/1985 |
| JP | 10-195178 A | * | 7/1998 |

* cited by examiner

*Primary Examiner*—Robert E.L. Sellers
(74) *Attorney, Agent, or Firm*—Lisa Kimes Jones

(57) ABSTRACT

An epoxy resin composition used for semiconductor encapsulating, laminated boards or electrical insulation is prepared from a thermosetting resin composition containing:
(A) an epoxy resin and
(B) a phenol resin
represented by the following general formula (1):

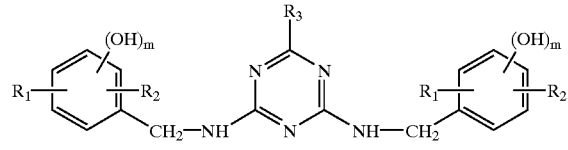

wherein $R_1$ and $R_2$ are a hydrogen atom or alkyl group having 1 to 4 carbon atoms, and $R_3$ is an amino group, alkyl group having 1 to 4 carbon atoms, phenyl group, vinyl group or the like, and wherein m is an integer of 1 or 2.

8 Claims, No Drawings

COMPOSITION OF EPOXY RESIN AND TRIAZINE-FORMALDEHYDE-PHENOL RESIN

1. FIELD OF THE INVENTION

The present invention relates to a thermosetting resin composition for providing a cured product which has excellent heat resistance and electric properties and which is useful as a laminated board, encapsulating material, adhesive, coating or electric insulating material.

2. BACKGROUND OF THE INVENTION

An epoxy resin is used in various fields since it has excellent heat resistance, adhesion, water resistance, mechanical strength and electric properties. The epoxy resin used is generally a diglycidyl ether of bisphenol A or phenol or cresol novolak type epoxy resin or the like.

However, as the above epoxy resin alone has no flame retardancy, it is often used in conjunction with a halogen-based flame retardant, antimony trioxide or aluminum hydroxide or the like for application in electric and electronic material parts which require high flame retardancy.

However, a halogen-based flame retardant is apprehended as one of the sources of a dioxine which has become a social problem, antimony trioxide has problems such as toxicity and a decrease in insulating properties, and aluminum hydroxide involves such a problem that when it is blended in large quantities, electric properties decrease. Therefore, a flame retardant comprising another compound which can replace these substances or reduce the amounts of these substances is proposed. Or, where flame retarding formulation is strongly desired, there are proposed a method of adding a phosphorus-based compound flame retardant (Japanese Patent Application Laid-open Nos. 11-124489 and 11-166035) and a method of using a compound having a triazine ring (Japanese Laid-open Patent Application Nos. 03-62825 and 08-253557).

However, the addition of a phosphorus-based compound has such a demerit that basic properties such as heat resistance and humidity resistance are lost because a phosphorus-based compound must be used in large quantities to provide sufficient flame retardancy.

The method of using a compound having a triazine ring is advantageous from an environmental point of view because it is a nitrogen compound but has a problem with the effect of improving the flame retardancy of an epoxy cured product because only a small amount of the triazine ring can be introduced into the molecule.

The present invention is to provide a thermosetting resin composition which can provide a cured product having excellent flame retardancy without impairing the heat resistance of an epoxy cured product and contains an epoxy resin and a specific phenol resin curing agent having a triazine ring.

The inventors of the present invention have conducted intensive studies on a compound having a triazine ring and have found that a cured product having an excellent effect of improving flame retardancy can be obtained from a specific phenol resin having at least one triazine ring in the molecule without impairing the performance of an epoxy resin.

3. SUMMARY OF THE INVENTION

Accordingly the present invention relates to:

A thermosetting resin composition comprising the following components (A) and (B):

component (A): an epoxy resin, and component (B): a phenol resin containing a phenol compound represented by the following general formula (1):

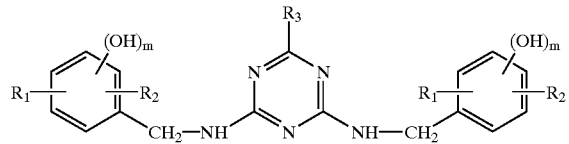

wherein $R_1$ and $R_2$ are a hydrogen atom or alkyl group having 1 to 4 carbon atoms, $R_3$ is an amino group, alkyl group having 1 to 4 carbon atoms, phenyl group, vinyl group or any one of the following general formula (2)

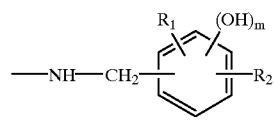

and general formula 3:

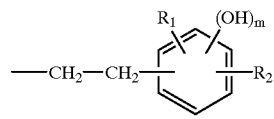

[wherein $R_1$ and $R_2$ in the general formulae (2) and (3) are a hydrogen atom or alkyl group having 1 to 4 carbon atoms, and m is an integer of 1 or 2.]

A preferred embodiment of said thermosetting resin composition is that one, wherein the hydroxyl group of the phenol resin as the component (B) is contained in an amount of 0.1 to 2 equivalents based on 1 equivalent of the epoxy group of the epoxy resin as the component (A).

In a more preferred thermosetting resin composition the component (B) is a phenol resin containing a phenol compound represented by the above general formula (1) in an amount of 10 to 90 wt %.

In a further preferred thermosetting resin composition, the component (B) is a phenol resin containing a phenol compound represented by the following general formula(e) (4) and/or (5)

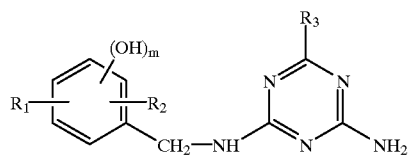

[wherein $R_1$ and $R_2$ are a hydrogen atom or alkyl group having 1 to 4 carbon atoms, $R_3$ is an amino group, alkyl group having 1 to 4 carbon atoms, phenyl group, vinyl group or any one of the above general formulae (2) and (3), and m is an integer of 1 or 2,] and n is an integer of 0 to 20, in addition to the phenol compound represented by the above general formula (1).

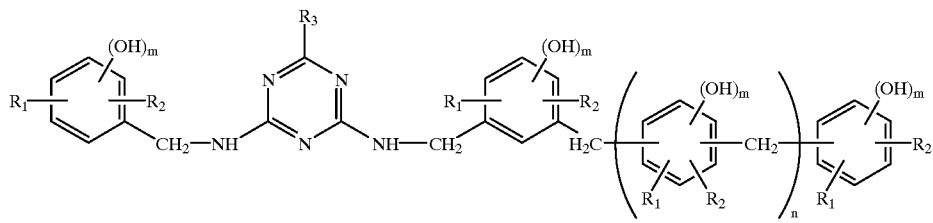

In a further preferred thermosetting resin compound the component (B) is a phenol resin containing a phenol compound represented by the herein before depicted general formula (4) in an amount of 1 to 45 wt % and/or a phenol resin containing a phenol compound represented by the herein before depicted general formula (5) in an amount of 10 to 80 wt %.

In the most preferred thermosetting resin composition the component (B) is a phenol resin produced by reacting a methylol product of a triazine compound with phenols.

In an other preferred thermosetting resin composition, wherein a curing accelerator is contained in an amount of 0.01 to 10 parts by weight based on 100 parts by weight of the epoxy resin.

In a more preferred thermosetting resin composition, the curing accelerator is a compound selected from the group consisting of tertiary amines, imidazoles and organic phosphines.

Preferred thermosetting resin compositions are comprising a metal hydroxide in an amount of 1 to 50 parts by weight based on 100 parts by weight of the hereinbefore specified epoxy.

More preferablely in the thermosetting resin composition the metal hydroxide is a compound selected from the group consisting of aluminum hydroxide and magnesium hydroxide.

The hereinbefore specified thermosetting resin composition is used for laminated boards, encapsulating materials or powder coatings

4. DETAILED DESCRIPTION OF THE INVENTION

Component (A): epoxy resin

The epoxy resin as the component (A) used in the present invention is a general epoxy resin. Examples of the epoxy resin include:

(1) Aromatic Diglycidyl Ethers;

diglycidyl ethers of bisphenol A, diglycidyl ethers of bisphenol F, diglycidyl ethers of 3,3', 5,5'-tetramethylbisphenol A, diglycidyl ethers of 3,3', 5,5'-tetramethylbisphenol F, diglycidyl ethers of bisphenol S, diglycidyl ethers of dihydroxyphenyl, diglycidyl ethers of biphenols, diglycidyl ethers of 3,3', 5,5'-tetramethylbiphenol, diglycidyl ethers of naphthalene diol, etc.

(2) Polyfunctional Epoxies;

phenol novolak type epoxy resins, cresol novolak type epoxy resins, naphthol novolak type epoxy resins, bisphenol A novolak type epoxy resins, epoxy resins obtained from triphenol methane, epoxy resins obtained from tetraphenol ethane, etc.

(3) Others;

glycidyl esters obtained from phthalic acid, hexahydrophthalic acid, dimer acid and the like, glycidylamines obtained from aminophenol, diaminodiphenyl methane and the like, aliphatic epoxies obtained from 1,4-butanediol, 1,6-hexanediol and the like, alicyclic epoxies obtained from cyclohexane dimethanol, hydrogenated bisphenol A and the like, alicyclic aliphatic epoxies obtained from a cycloolefin such as 3,4-epoxycyclohexylmethyl-3', 4'-epoxycyclohexane carboxylate and peracetic acid, and epoxy resins obtained from a condensation reaction of one or more of the above aromatic diglycidyl ethers, polyfunctional epoxies and others with bisphenols (bisphenol A, bisphenol F, bisphenol S, dihydroxydiphenyl ethers, biphenols, 3,3', 5,5'-tetramethylbiphenol, naphthalene diol and the like).

Component (B): Phenol Resin

The phenol resin as the component (B) used in the present invention functions as a curing agent for the epoxy resin as the component (A) and contains a phenol compound represented by the following general formula (1),

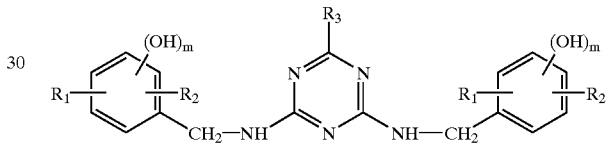

having at least one triazine ring in one molecule, [wherein $R_1$ and $R_2$ are a hydrogen atom or alkyl group having 1 to 4 carbon atoms, $R_3$ is an amino group, alkyl group having 1 to 4 carbon atoms, phenyl group, vinyl group or any one of the above general formulas (2)

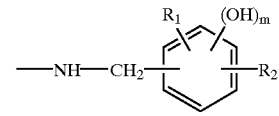

and (3):

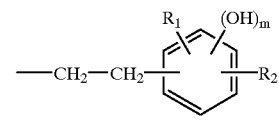

[wherein, $R_1$ and $R_2$ are in the general formulae (2) and (3) are a hydrogen atom or alkyl group having 1 to 4 carbon atoms, and m is an integer of 1 or 2.]

The phenol resin containing a phenol compound represented by the above general formula (1) in an amount of 10 to 90 wt % is preferred.

When the phenol compound represented by the above general formula (1) is contained in the phenol resin in an amount of less than 10 wt %, the heat resistance of an epoxy cured product decreases disadvantageously. When the amount is larger than 90 wt %, the softening temperature of the phenol resin rises, thereby making it difficult to handle the phenol resin, which is not preferable.

The phenol resin containing the phenol compounds represented by the following general formula(4):

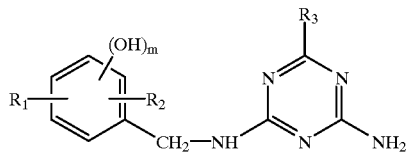

and (5):

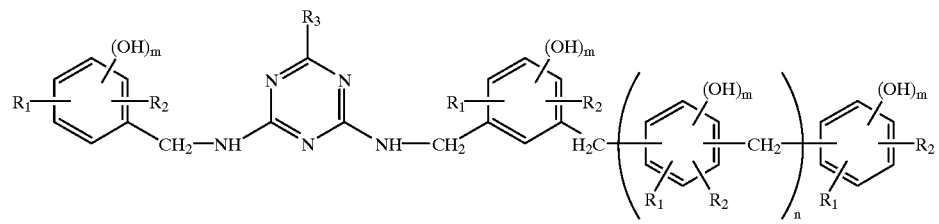

[wherein $R_1$ and $R_2$ are a hydrogen atom or alkyl group having 1 to 4 carbon atoms, $R_3$ is an amino group, alkyl group having 1 to 4 carbon atoms, phenyl group, vinyl group or any one of the above general formulae (2) and (3), and m is an integer of 1 or 2, and n is an integer of 0 to 20, is preferred from the viewpoint of handling properties of the phenol resin.

When the phenol compound represented by the general formula (4) is contained in the phenol resin in an amount of more than 45 wt %, the heat resistance of the epoxy cured product decreases disadvantageously.

The phenol resin containing the phenol compound represented by the general formula (5) in an amount of 10 to 80 wt % is particularly preferred from the viewpoints of handling properties and flame retardancy.

Preferably, the phenol resin of the present invention is first obtained by reacting an aqueous solution of formaldehyde with a triazine ring-containing compound to introduce methylol groups into the triazine ring-containing compound. A large number of triazine rings are introduced into the phenol resin by this reaction, thereby making it possible to improve the flame retardancy of an epoxy cured product.

After a phenol is added to the obtained reaction solution to carry out a dehydration reaction, or the methylol product is alkoxylated with an alcohol to carry out an alcohol removing reaction, unreacted phenol is distilled off to obtain a phenol resin.

The method of carrying out an alcohol removing reaction after the methylol product is alkoxylated with an alcohol is preferred because the homopolymerization of the triazine compound can be prevented.

Examples of the triazine ring-containing compound include melamine, acetoguanamine, ethylguanamine, butylguanamine, benzoguanamine, vinylguanamine and the like.

Examples of the phenol include phenol, cresol, ethylphenol, propylphenol, butylphenol, xylenol, 2-tert-butyl-4-methylphenol, 2-tert-butyl-5-methylphenol, catechol, resorcin and the like.

As for the reaction method, a methylol product is formed by using 1 to 10 moles of formaldehyde based on 1 mole of the triazine ring-containing compound at a temperature of 30 to 150° C. The dehydration or alcohol removing reaction is carried out at a temperature of 50 to 200° C. by using the phenol in an amount of 2 to 30 moles based on 1 mole of the obtained methylol product to obtain a phenol resin.

The blending ratio of the epoxy resin as the component (A) to the phenol resin as the component (B) is such that the amount of the hydroxyl group of the phenol resin as the component (B) becomes 0.1 to 2 equivalents, preferably 0.15 to 1.5 equivalents based on 1 equivalent of the epoxy group of the epoxy resin as the component (A).

Outside the above range, the heat resistance and the humidity resistance of the epoxy resin curing agent are imbalanced disadvantageously, and therefore not preferable.

A curing accelerator can be added in the thermosetting resin composition of the present invention for the purpose of promoting curing. Preferred examples of the curing accelerator include the following.
(1) Tertiary Amines;
  tri-n-butylamine, benzyldimethylamine, 2,4,6-tris(dimethylaminomethyl)phenol, 1,8-diazabicyclo(5,4,0)undecene-7, 1,5-diazabicyclo(4,3,0)nonene-7 and the like, and salts thereof.
(2) Imidazoles;
  2-methylimidazole, 2-ethyl-4-methylimidazole, 1-benzyl-2-methylimidazole, 2-undecylimidazole, 2-phenylimidazole and the like, and salts thereof.
(3) Organic Phosphines;
  tributylphosphine, tricyclohexylphosphine, triphenylphosphine and tris(dimethoxyphenyl)phosphine, and salts thereof.

These curing accelerators may be used alone or in combination of two or more. The amount of the curing accelerator is 0.01 to 10 parts by weight, preferably 0.02 to 5 parts by weight based on 100 parts by weight of the epoxy resin as the component (A).

When the amount of the curing accelerator is smaller than 0.01 part by weight, the effect of promoting the curing of the composition of the present invention is small and when the amount is larger than 10 parts by weight, the water resistance of a cured product deteriorates disadvantageously, and therefore not preferable.

The flame retardancy can be further improved by containing a metal hydroxide in the thermosetting composition of the present invention.

Examples of the metal hydroxide include aluminum hydroxide, magnesium hydroxide and the like. They may be used in combination of two or more, but aluminum hydroxide is particularly preferred.

The amount of the metal hydroxide is 1 to 50 parts by weight, preferably 2 to 30 parts by weight based on 100 parts by weight of the epoxy resin as the component (A). When the amount of the metal hydroxide is smaller than 1 part by weight, the effect of flame retarding the composition of the present invention is small and when the amount is larger than 50 parts by weight, the electric properties of the cured product deteriorate disadvantageously, and therefore not preferable.

The following components may be added to the thermosetting resin composition of the present invention as required.

(1) Powdery reinforcement and filler; for example, metal oxides such as aluminum oxide and magnesium oxide, metal carbonates such as calcium carbonate and magnesium carbonate, silicon compounds such as diatomaceous earth powder, basic magnesium silicate, burned clay, fine powder silica, molten silica and crystal silica, and others such as kaolin, mica, quartz powder, graphite and molybdenum disulfide, and further, fibrous reinforcement and filler; for example, glass fiber, ceramic fiber, carbon fiber, alumina fiber, silicon carbide fiber, boron fiber, polyester fiber, polyamide fiber and the like.

They are used in an amount of 10 to 900 parts by weight based on 100 parts by weight of the sum of the epoxy resin and the curing agent.

(2) Colorant, pigment and flame retardant such as titanium dioxide, iron black, molybdenum red, iron blue, ultramarine blue, cadmium yellow, cadmium red, antimony trioxide, red phosphorus, bromine compound, triphenyl phosphate and the like.

They are used in an amount of 0.1 to 20 parts by weight based on 100 parts by weight of the sum of the epoxy resin and the curing agent.

(3) Curable monomers, oligomers and synthetic resins can be added for the purpose of improving the properties of a resin in the final coating film, adhesive layer, molded product and the like. For example, combination of one or more of an epoxy resin diluent such as monoepoxy, a phenol resin other than the component (B) of the present invention, alkyd resin, melamine resin, fluororesin, vinyl chloride resin, acrylic resin, silicone resin and polyester resin may be used. The proportion of the resin(s) is such that it does not impair the original properties of the resin composition of the present invention, that is, preferably 50 parts or less by weight based on 100 parts by weight of the total of the epoxy resin and the curing agent.

Means of blending the epoxy resin of the present invention, an epoxy resin curing agent and optional components may be thermal melt mixing, melt kneading with a roll or kneader, wet mixing with an appropriate organic solvent, dry mixing, or the like.

Effect of the Invention

The present invention provides an epoxy resin cured product which is cured using a phenol resin having a high flame retardancy unseen conventionally providing effect as a curing agent and whose flame retardancy, heat resistance and humidity resistance are well balanced. Therefore, it can be used for a wide variety of application purposes and advantageously used especially in electric and electronic fields such as semiconductor encapsulating materials, laminated board materials and electric insulating materials.

The following examples and comparative examples are given to further illustrate the present invention, however, without restriction its scope to these embodiments.

PRODUCTION EXAMPLE 1 OF PHENOL RESIN 126 g (1 mole) of melamine and 162 g (2 moles) of a 37% aqueous solution of formaldehyde were charged into a 2-liter four-necked flask equipped with a stirrer and thermometer, and a methylol introduction reaction was carried out at 70° C. for 2 hours to obtain a homogeneous aqueous solution. After the end of the reaction, 192 g of methanol was added to the reaction system to carry out a reaction under the reflux of methanol for 2 hours so as to methoxylate the methylol product of melamine. Thereafter, 564 g (6 moles) of phenol was added to the reaction system, the temperature was elevated to 180° C. over 3 hours while methanol was distilled off, and a methanol removing reaction was carried out at the same temperature for another 1 hour. After the end of the reaction, the system was depressurized to distill off unreacted phenol to obtain a yellow solid phenol resin.

The properties of this phenol resin are shown in Table 1.

PRODUCTION EXAMPLE 2 OF PHENOL RESIN

The operation of the above Production Example 1 was repeated to obtain a yellow solid phenol resin except that 243 g (3 moles) of a 37% aqueous solution of formaldehyde, 288 g of methanol and 9 moles of phenol were charged based on 126 g (1 mole) of melamine.

The properties of this phenol resin are shown in Table 1.

PRODUCTION EXAMPLE 3 OF PHENOL RESIN

The operation of the above Production Example 1 was repeated to obtain a yellow solid phenol resin except that the melamine was changed to 187 g (1 mole) of benzoguanamine and the amount of the formaldehyde aqueous solution was changed to 110 g (1.36 moles).

The properties of this phenol resin are shown in Table 1.

COMPARATIVE PRODUCTION EXAMPLE 1 OF PHENOL RESIN 940 g (10 moles) of melamine, 324 g (4 moles) of a 37% aqueous solution of formaldehyde and 5 g of triethylamine were charged into a 2-liter four-necked flask equipped with a stirrer and thermometer to carry out a reaction at a temperature of 80° C. for 3 hours. 190 g (1.5 moles) of melamine was added to the reaction system to carry out a reaction for another 1 hour, and the temperature was elevated to 120° C. while water was distilled off to carry out a reaction at the same temperature for 2 hours. After the temperature was then elevated to 180° C. over 2 hours, the flask was depressurized to distill off unreacted phenol so as to obtain a yellow solid phenol resin.

The properties of this phenol resin are shown in Table 1.

TABLE 1

| | | Production Example 1 | Production Example 2 | Production Example 3 | Comparative Production Example 1 |
|---|---|---|---|---|---|
| Equivalent of hydroxyl group (g/equivalent) | | 169 | 148 | 202 | 120 |
| Softening temperature (° C.) | | 120 | 140 | 110 | 140 |
| Melt viscosity (Ps) *1 | | 2.5 | 7.0 | 2.7 | 46 |
| Nitrogen content (%) *2 | | 26 | 20 | 17 | 8 |
| *3 Composition of phenol resin (%) | Phenol compound of general formula (1) | 48 | 37 | 50 | — |
| | Phenol compound of general formula (4) | 25 | 10 | 27 | — |

TABLE 1-continued

|  | Production Example 1 | Production Example 2 | Production Example 3 | Comparative Production Example 1 |
|---|---|---|---|---|
| Phenol compound of general formula (5) | 27 | 53 | 23 | — |

(notes)
*1 ICI viscosity at 200° C.
*2 elemental analysis
*3 proportion of each phenol compound content, obtained by gel permeation chromatography

COMPARATIVE PRODUCTION EXAMPLE 2 OF PHENOL RESIN

The operation of Comparative Production Example 1 was repeated to obtain a yellow solid phenol resin except that the amount of melamine was changed to 473 g (3.75 moles) to increase the content of nitrogen. However, since unreacted melamine remained in large quantities, the subsequent operation was not carried out.

EXAMPLE 1

100 parts by weight of diglycidyl ether of bisphenol A (Epikote 828EL; trade name of Yuka Shell Epoxy Co., epoxy equivalent; 186 g/equivalent), 61 parts by weight of the phenol resin obtained in Production Example 1 and 29 parts by weight of aluminum hydroxide (Higilite H-32; trade name of Showa Denko Colo.) were mixed together at a temperature of 120° C. and defoamed to obtain a solution containing aluminum hydroxide dispersed uniformly therein. The amount of the hydroxyl group of the phenol resin was 0.67 equivalent based on 1 equivalent of the epoxy group of the epoxy resin. Thereafter, 1 part by weight of triphenylphosphine was added, stirred and mixed to obtain a thermosetting resin composition.

Thereafter, the composition was poured into a mold and cured in an oven at 120° C. for 2 hours and then at 180° C. for 7 hours to obtain a cured product. The physical property values of this cured product are shown in Table 2.

EXAMPLES 2 TO 6 AND COMPARATIVE EXAMPLES 1 AND 2

The operation of Example 1 was repeated to obtain compositions and cured products except that the epoxy resin and the phenol resin were changed as shown in Table 2. The amount of the hydroxyl group of the phenol resin based on 1 equivalent of the epoxy group of the epoxy resin was 0.67 (Example 2), 0.63 (Example 3), 0.67 (Example 4), 0.67 (Example 5), 0.63 (Example 6), 0.83 (Comparative Example 1) and 1.0 (Comparative Example 2) equivalent. The physical property values of these cured products are shown in Table 2.

TABLE 2

|  | Example 1 | Example 2 | Example 3 | Example 4 | Example 5 | Example 6 | Comparative Example 1 | Comparative Example 2 |
|---|---|---|---|---|---|---|---|---|
| Epoxy resin (parts by weight) | *4 E828EL 100 | same as left 100 | same as left 100 | *5 YX4000H 100 | same as left 100 | same as left 100 | E828EL 100 | same as left 100 |
| Phenol resin (parts by weight) | Production Example 1 61 | Production Example 2 53 | Production Example 3 68 | Production Example 1 58 | Production Example 2 51 | Production Example 3 65 | Comparative Production Example 1 54 | *6 PSM 4327 56 |
| Curing accelerator | *7 TPP 1 | same as left 1 | same as left 1 | same as left 1 | same as left 1 | same as left 1 | same as left 1 | same as left 1 |
| Filler (parts by weight) | *8 Higilite H-32 29 | same as left 27 | same as left 30 | same as left 28 | same as left 27 | same as left 29 | same as left 27 | same as left 28 |
| Curing conditions | 120° C. for 2 hours + 180° C. for 7 hours | | | | | | | |
| Glass transition temperature (C) *1 | 133 | 128 | 116 | 146 | 140 | 127 | 115 | 118 |
| Coefficient of moisture absorption (%) *2 | 1.6 | 1.4 | 1.5 | 1.4 | 1.3 | 1.3 | 1.8 | 1.5 |
| Flame retardancy *3 | V-0 | V-0 | V-0 | V-0 | V-0 | V-0 | V-1 | HB |

(Notes)
*1 TMA method, temperature was elevated at a rate of 5° C./min.
*2 an increase rate from the initial weight after 7 days of storage at a temperature of 85° C. and a relative humidity of 85%.
*3 UL method
*4 diglycidyl ether of bisphenol A, epoxy equivalent = 186 g/equivalent (trade name of Yuka Shell Epoxy Co.)
*5 diglycidyl ether of 3,3',5,5'-tetramethylbiphenol, epoxy equivalent = 193 g/equivalent (trade name of Yuka Shell Epoxy Co.)
*6 phenol novolak resin, hydroxyl group equivalent: 105 g/equivalent (trade name of Gun Ei Chemical Industry)
*7 triphenyiphosphine
*8 aluminum hydroxide (trade name of Showa Denko Co.)

We claim:

1. A thermosetting resin composition comprising the following components (A) and (B):

component (A): an epoxy resin, and component (B): a phenol resin containing a phenol compound represented by the following general formula (1):

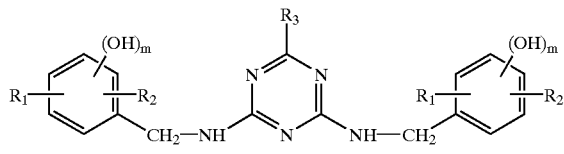

wherein $R_1$ and $R_2$ are a hydrogen atom or alkyl group having 1 to 4 carbon atoms, m is an integer of 1 or 2, and $R_3$ is an amino group, alkyl group having 1 to 4 carbon atoms, phenyl group, vinyl group or any one of the following general formulae (2)

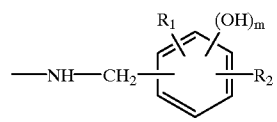

and (3):

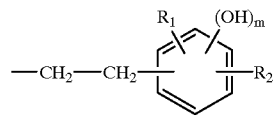

wherein $R_1$, $R_2$ and m are as defined before.

2. The thermosetting resin composition as claimed in claim 1, wherein the hydroxyl group of the phenol resin as the component (B) is contained in an amount of 0.1 to 2 equivalents based on 1 equivalent of the epoxy group of the epoxy resin as the component (A).

3. The thermosetting resin composition as claimed in claim 2, wherein the component (B) comprises a phenol resin comprising a phenol compound represented by the above general formula (1) in an amount of 10 to 90 wt %.

4. The thermosetting resin composition as claimed in claim 1, wherein the component (B) comprises a phenol resin produced by reacting a methylol product of a triazine compound with phenols.

5. The thermosetting resin composition as claimed in claim 1, wherein a curing accelerator is contained in an amount of 0.01 to 10 parts by weight based on 100 parts by weight of the epoxy resin.

6. The thermosetting resin composition as claimed in claim 5, wherein the curing accelerator comprises a compound selected from the group consisting of tertiary amines, imidazoles and organic phosphines.

7. A thermosetting resin composition comprising a metal hydroxide in an amount of 1 to 50 parts by weight based on 100 parts by weight of the epoxy resin according to claim 1 and wherein the metal hydroxide is selected from the group consisting of aluminum hydroxide and magnesium hydroxide.

8. A thermosetting resin composition for laminated boards, encapsulating materials or powder coatings, comprising the resin composition set forth in any one of claim 1.

* * * * *